United States Patent [19]

Kim

[11] Patent Number: 5,764,178

[45] Date of Patent: Jun. 9, 1998

[54] DELAY CHARACTERISTIC COMPENSATION CIRCUIT FOR MEMORY DEVICE

[75] Inventor: Dae Jeong Kim, Seoul, Rep. of Korea

[73] Assignee: LG Semicon Co., Ltd., Cheongju, Rep. of Korea

[21] Appl. No.: 682,822

[22] Filed: Jul. 12, 1996

[30] Foreign Application Priority Data

Jul. 15, 1995 [KR] Rep. of Korea .................. 1995-20902

[51] Int. Cl.$^6$ .................................................. G08C 19/12
[52] U.S. Cl. ........................... 341/173; 365/174; 327/141
[58] Field of Search .......................... 341/173; 365/174, 365/194, 226; 327/141, 158, 261, 262, 277

[56] References Cited

U.S. PATENT DOCUMENTS 5,386,150  1/1995  Yonemoto ........................ 327/141
5,638,333  6/1997  Lee ................................. 365/205

*Primary Examiner*—Jeffery Hofsass
*Assistant Examiner*—Andrew Hill
*Attorney, Agent, or Firm*—Fleshner & Kim

[57] ABSTRACT

An improved delay characteristic compensation circuit for a memory device which is capable of constantly maintaining the characteristic of the delay path by connecting or disconnecting the delay devices to the delay path by detecting quickly the variation of the supply voltage, which includes a signal delay unit for sequentially delaying an input signal; a voltage variation detector for detecting a variation of a digital supply voltage and adjusting the level of a divide voltage with respect to the supply voltage at a predetermined ratio; a code data generator for generating a code data in accordance with the voltage adjusted by the voltage variation detector; and a delay characteristic compensation unit for connecting a predetermined number of delay devices to a delay path of the delay unit in accordance with a code data generated by the code data generator for dividing the same so as to constantly maintain the delay characteristic of the delay unit.

11 Claims, 2 Drawing Sheets

DELAY CHARACTERISTIC COMPENSATION CIRCUIT FOR MEMORY DEVICE

BACKGROUND OF THE INVENTION

1. Field of the Invention

The present invention relates to a delay characteristic compensation circuit for a memory device, and particularly to an improved delay characteristic compensation circuit for a memory device which is capable of compensating a delay characteristic of a delay device which is varied in accordance with a digital supply voltage variation by supplying a digital supply voltage and an analog supply voltage to a high speed DRAM using a delay-locked loop.

2. Description of the Conventional Art

FIG. 1 shows a delay characteristic compensation circuit for a conventional memory device, which includes an inverter 1 for inverting a feeding-back clock CLK, an oscillator 100 having a plurality of delay devices 2–7 for generating a clock CLK having a predetermined frequency by adjusting the delay characteristic of a clock inverted by the inverter 1 in accordance with the bias voltage Vbias inputted thereto, and a phase detector 110 for detecting a phase difference by comparing the frequency of the clock CLK outputted from the delay device 7 of the oscillator 100 with the reference frequency Fref, and for generating a bias voltage Vbias in accordance with the detected phase difference.

In addition, as shown in FIG. 2, each of the delay devices 2–7 includes a PMOS transistor PM1 having the source terminal for receiving a voltage Vdd therethrough, and the gate terminal connected with an input line IN, an NMOS transistor NM1 having the drain terminal connected with the drain terminal of the PMOS transistor PM1, and the gate terminal connected with the input line IN, and an NMOS transistor NM2 having the drain terminal connected with the source terminal of the NMOS transistor NM1, the gate terminal for receiving a bias voltage Vbias therethrough, and the source terminal connected to ground. In addition, there are provided a PMOS transistor PM3 having the source terminal for receiving the voltage Vdd therethrough, the gate terminal connected to the point between the drain gate of the PMOS transistor PM1 and the drain terminal of the NMOS transistor NM1, and the drain terminal connected to an output line OUT, and an NMOS transistor NM3 having the drain terminal connected with the output line OUT, the gate terminal connected to both the gate terminal of the PMOS transistor PM3 and the point between the drain gate of the PMOS transistor PM1 and the drain terminal of the NMOS transistor NM1, and the source terminal connected to ground.

The operation of the delay characteristic compensation circuit for a conventional memory device will now be explained with reference to the accompanying drawings.

First, when the feeding-back clock CLK is applied to the inverter 1 of the oscillator 100, the inverter 1 inverts the clock CLK inputted, and applies to the delay device 2.

The plurality of delay devices 2–7 generate a clock CLK having a predetermined frequency in accordance with a bias voltage Vbias inputted thereto, and applies to the phase detector 110.

The phase detector 110 compares the previously set reference frequency Fref with the phase of the clock CLK having a predetermined frequency applied thereto from the delay devices 2–7, and applies the bias voltage Vbias corresponding to the detected phase difference to the delay devices 2–7.

Therefore, the delay devices 2–7 delay the clock applied thereto from the inverter 1 in accordance with the bias voltage Vbias applied thereto from the phase detector 110 for a predetermined time.

The delay of the clock applied from the inverter 1 will now be explained in more detail with reference to FIG. 2.

First, since the PMOS transistor PM1 and the NMOS transistor NM1 of the delay devices 2–7 are turned off/on in accordance with the clock of high level applied from the inverter 1, and the NMOS transistor NM2 is turned on in accordance with the bias voltage Vbias which is fed-back and inputted thereto from the phase detector 110, and the driving capacity of the NMOS transistor NM2 is determined in accordance with the bias voltage Vbias, and the amount of the current flowing through the ground terminal and the NMOS transistors NM1 and NM2 is controlled.

Therefore, since the amount of the current is applied to the gates of the PMOS transistor PM3 and the NMOS transistor NM3 is controlled by the bias voltage Vbias, the amount of the voltage applied to the out line OUT through the PMOS transistor PM3 is controlled, and then the amount of the controlled voltage is applied to the phase detector 110 as the clock CLK.

Therefore, the phase detector 110 and the oscillator 100 repeat the above-described process for a predetermined time, and finally the reference frequency Fref previously set by the phase detector 110 and the frequency of the clock CLK delayed by and outputted from the delay devices 2–7 become identical, so that the delay characteristic of the delay devices 2–7 are compensated.

However, since the delay characteristic compensation circuit of the conventional memory device is directed to comparing the reference delay time with the delay time of the delay devices which are connected in series, to feeding-back the bias voltage to the delay devices, so that since it is impossible to compensate abrupt bump noise or the like which is supplied to the external supply voltage, it is difficult to adapt the conventional delay characteristic compensation circuit to the DLL circuit or the like so as to constantly maintain the delay characteristic of the delay device by correcting the noise such as bump voltage or the like.

SUMMARY OF THE INVENTION

Accordingly, it is an object of the present invention to provide a delay characteristic compensation circuit for a memory device, which overcome the problems encountered in a conventional delay characteristic compensation circuit for a memory device.

It is another object of the present invention to provide an improved delay characteristic compensation circuit for a memory device which is capable of constantly maintaining the characteristic of the delay path by connecting or disconnecting the delay devices to the delay path by detecting quickly the variation of the supply voltage.

To achieve the above objects, there is provided a delay characteristic compensation circuit for a memory device, which includes a signal delay unit for sequentially delaying an input signal; a voltage variation detector for detecting a variation of a digital supply voltage and adjusting the level of a divide voltage with respect to the supply voltage at a predetermined ratio; a code data generator for generating a code data in accordance with the voltage adjusted by the voltage variation detector; and a delay characteristic compensation unit for connecting a predetermined number of delay devices to a delay path of the delay unit in accordance with a code data generated by the code data generator for dividing the same so as to constantly maintain the delay characteristic of the delay unit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
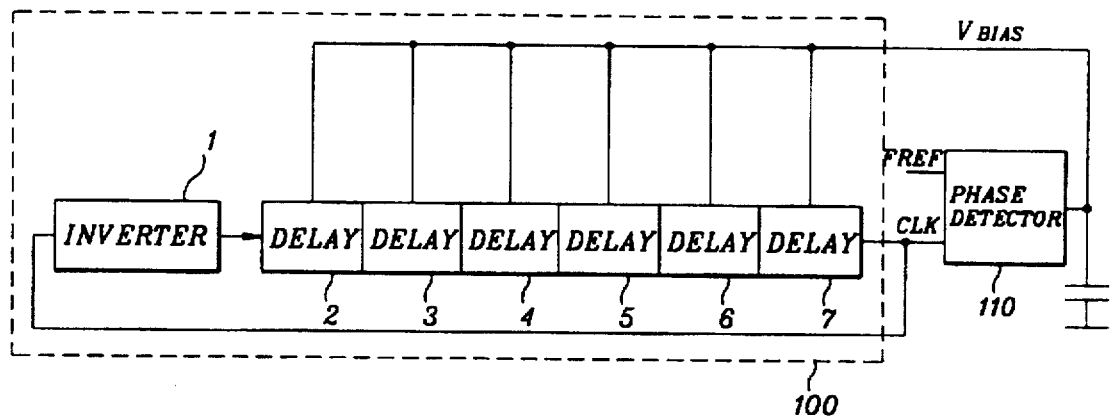
FIG. 1 is a diagram showing a delay characteristic compensation circuit for a conventional memory device.
Figure 2:
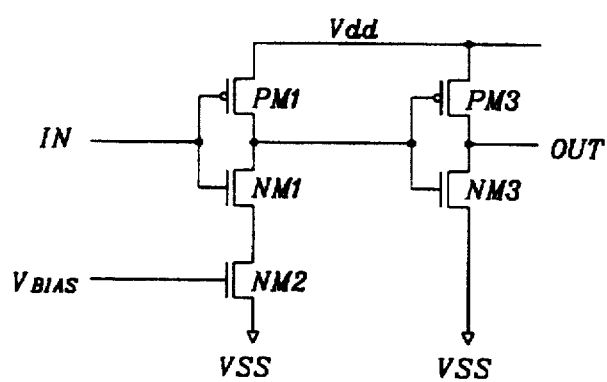
FIG. 2 is a detailed circuit diagram of a delay device of FIG. 1.
Figure 3:
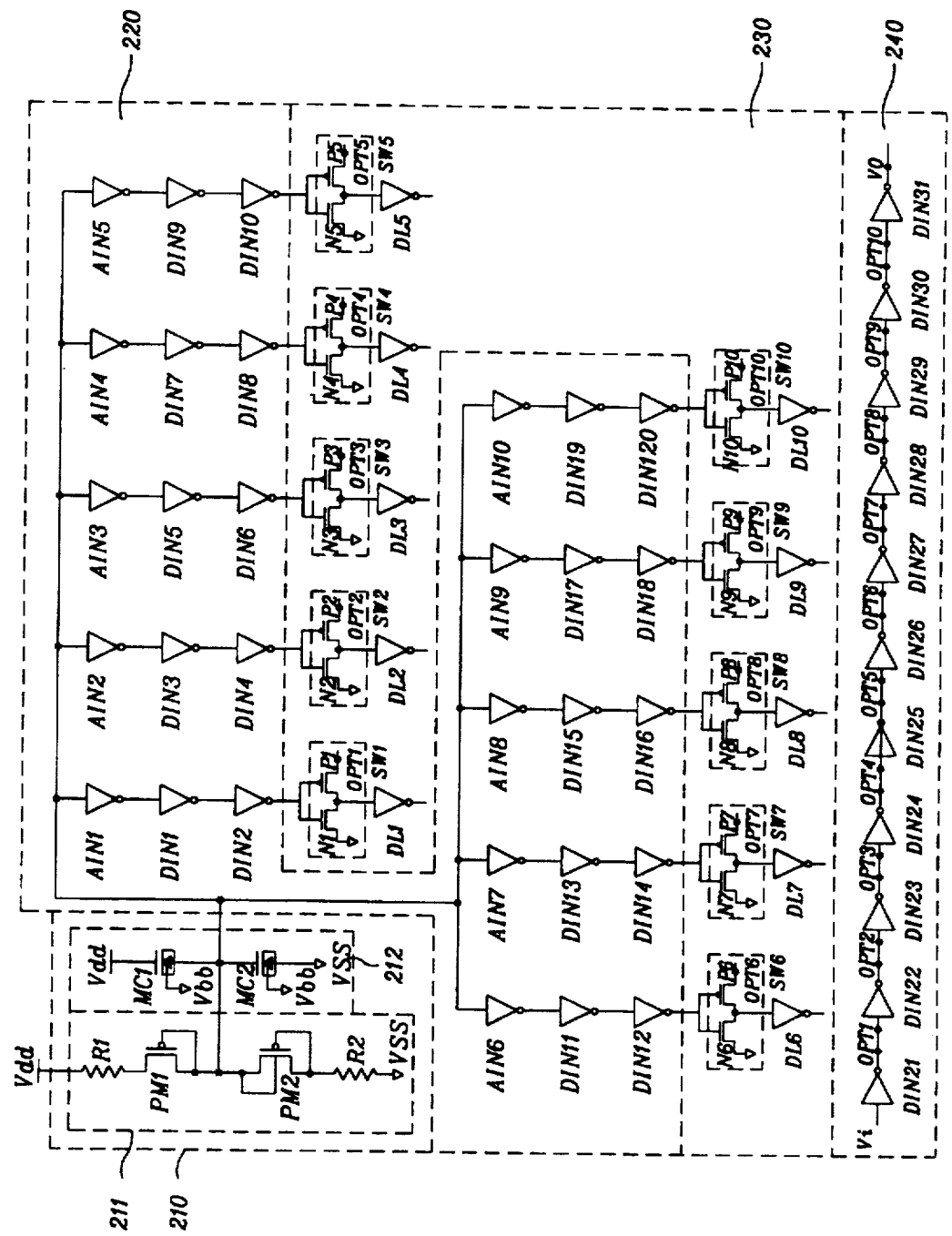
FIG. 3 is a circuit diagram showing a delay characteristic compensation circuit for a memory device according to the present invention.

FIG. 3 shows a delay characteristic compensation circuit of a memory device according to the present invention, which includes a signal delay unit 240 having inverters DIN21–DIN31 for generating an output signal Vo by sequentially delaying the input signal Vi, a voltage variation detection unit 210 for detecting a bump noise of a digital supply voltage, a code data generator 220 for generating a code data in accordance with the voltage level detected by the voltage variation detection unit 210, and a delay characteristic compensation unit 230 for compensating so as to constantly maintain the delay characteristic of the signal delay unit 240 in accordance with the code data generated by the code data generator 220.

The voltage variation detection unit 210 includes a divide voltage generator 211 for dividing the digital supply voltage Vdd, and a voltage variation detector 212 for detecting the variation of the digital supply voltage in accordance with the divide voltage generated by the divide voltage generator 211 and for outputting the detected voltage.

The divide voltage generator 211 includes a PMOS transistor PM1 having the source terminal connected to the substrate terminal thereof and to which a digital supply voltage Vdd is supplied through a resistor R1, the gate terminal connected to the drain terminal thereof, and a PMOS transistor PM2 having the source terminal connected to the substrate terminal thereof and the drain terminal of the PMOS transistor PM1 and connected to the out line, and the gate terminal connected to the ground terminal through a resistor R2.

The voltage variation detector 212 includes PMOS transistors MC1 and MC2 connected between the digital supply voltage Vdd and the ground terminal in series, and the contact point between the PMOS capacitors MC1 and MC2 is connected to the output line of the divide voltage generator 211 and the input line of the code data generator 220.

The code data generator 220 includes analog inverters AIN1–AIN10, which are enabled in accordance with the voltage variation detected by the voltage variation detector 212 of the voltage variation detection unit 210, for having different threshold voltage by varying the ratio between the channel width and the length, and digital inverters DIN1, DIN2, DIN3, . . . , DIN20 connected to the analog inverters AIN1–AIN10 by two inverts thereamong in series for amplifying the signal applied thereto from the analog inverters AIN1–AIN10 and for generating the code data.

The analog inverters AIN1–AIN10 are connected between the analog supply voltage and the ground terminal, and the digital inverters DIN1, DIN2, . . . , DIN20 are connected between the digital supply voltage and the ground terminal.

The delay characteristic compensation unit 230 includes switches SW1–SW10 which are switched in accordance with the signal outputted to the digital inverters DIN2, DIN4, DIN6, DIN8, DIN10, DIN12, DIN14, DIN16, DIN18, DIN20 for outputting the signal outputted from the delay devices DIN21–DIN30, and delay devices DL1–DL10 for delaying the signal outputted from the switches SW1–SW10.

Each of the switches SW1–SW10 includes PMOS transistors and NMOS transistors (P1, N1), . . . , (P10, N10) each having the source terminal to which each of the output lines of the digital inverters DIN21–DIN31 of the signal delay unit 240 is connected, and the gate terminal to which the output line of the digital inverters DIN2, DIN4, DIN6, DIN8, DIN10, DIN12, DIN14, DIN16, DIN18, DIN20 of the code data generator 220 is commonly connected, and the drain terminal connected to each other and connected to the input line of the delay devices DL1–DL10.

Each of the delay devices DL1–DL10 includes an inverter or a MOS capacitor.

The operation and effects of the delay characteristic compensation circuit for a memory device according to the present invention will now be explained.

First, when the digital supply voltage Vdd is applied, when the input signal Vi is outputted as the output signal Vo through the digital inverters DIN21–DIN31 of the signal delay unit 240, and in case that the digital supply voltage Vdd has the normal state without bump noises, the resistors R1 and R2 and the PMOS transistors PM1 and PM2 of the divide voltage generator 211 of the voltage variation detection unit 210 divide the supplied digital supply voltage Vdd, and supply the Vdd/2 to the inverters AIN1–AIN10 of the code data generator 220 through the voltage variation detector 212.

The analog inverters AIN1–AIN5 recognize the Vdd/2 supplied thereto through the voltage variation detector 212 as a voltage having a higher level than the threshold voltage thereof, and then output a low level signal, and the analog inverters AIN6–AIN10 recognize the Vdd/2 as a voltage having a lower level than the threshold voltage thereof.

Therefore, the low level signals outputted from the analog inverters AIN1–AIN5 are commonly applied to the gate terminals of the PMOS transistors and NMOS transistors (P1,N1), . . . , (P5, N5) of the switches SW1–SW5 of the delay characteristic compensation unit 230 through the digital inverters (DIN1, DIN2), . . . , (DIN9–DIN10).

In addition, the high level signals outputted from the analog inverters AIN6–AIN10 are commonly applied to the gate terminals of the PMOS transistors and NMOS transistors (P6, N6), . . . , (P10, N10) of the switches SW6–SW10 through the digital inverters (DIN11, DIN12), . . . , (DIN19, DIN20).

Since the PMOS transistors and NMOS transistors (P1, N1), . . . , (P5, N5) are turned on/off in accordance with the low level signal applied to the gate terminals, and the PMOS transistors and NMOS transistors (P6, N6), . . . , (P10, N10) are turned on/off in accordance with the high level signal applied to the gate terminals thereof, the output lines of the digital inverters DIN21–DIN25 of the signal delay unit 240 are connected to the input lines of the delay devices DL1–DL5, and the output lines of the digital inverters DIN26–DIN30 are divided into input lines of the delay devices DL6–DL10.

Namely, since the analog inverters AIN1–AIN10 of the code data generator 220 are set inn order for the logic threshold voltage to be increased/decreased at a predetermined regular interval, when the Vdd/2 which had the normal state is applied to the analog inverters AIN1–AIN10, the PMOS transistors P1–P5 of the switches SW1–SW5 of the delay characteristic compensation unit 230 are turned on, and the PMOS transistors P6–P10 of the switches SW6–SW10 are turned off.

Therefore, the input signal Vi is delayed by the digital inverters DIN21–DIN31 of the signal delay unit 240, and is then outputted as the output signal Vo.

Meanwhile, when a predetermined variation occurs as much as ΔV for a time Δt by the bump noise, the MOS capacitors MC1 and MC2 of the voltage variation detector 12 of the voltage variation detection unit 210 couple the varied amount and generate the voltage as shown in the following expression (1) for the time Δt without delay, and the applies to the analog inverters AIN1–AIN10.

$$\frac{Cmc1}{Cmc1 + Cmc2 + C} \times \Delta V \quad (1)$$

where Cmc1 and Cmc2 denote MC1 and MC2, respectively, and C denotes the gate capacitance of the code data generator 220.

The analog inverters AIN1–AIN10 of the code data generator 220 are enabled/disabled more than in the normal state in accordance with the variation voltage applied thereto from the voltage variation detector 212.

Here, since the analog inverters AIN1–AIN10 are enabled by the logic threshold voltage, the swing of the output voltage occurs a little, so the switching noise does not occur by the analog supply voltage.

Therefore, the delay characteristic compensation unit 230 compensates the delay characteristic of the signal delay unit 240 and constantly maintains the same by further extending or separating the output lines of the digital inverters DIN21–DIN31 of the signal delay unit 240 and the input lines of the delay devices DL1–DL10 in accordance with the code data generated by the code data generator 220.

Thereafter, when a predetermined time lapses, the output voltage level of the voltage variation detection unit 210 is set as the voltage of Vdd/2 by the divide voltage generator 211 having the resistors R1 and R2 and the PMOS transistors PM1 and PM2.

The PMOS transistors PM1 and MP2 are set in order for the size of the device to be determined so as to minimize the standby current.

Meanwhile, another embodiment of the delay characteristic compensation circuit of the memory device according to the present invention is directed to removing the resistors R1 and R2 and is directed to adjusting the number of PMOS transistors by adjusting the weight of the PMOS transistors PM1 and PM2 in order for the voltage of Vdd/2 to be generated by the divide voltage generator 211 of the voltage variation detection unit 210.

In addition, when the variation of the ground electrical potential is high, the ground of the voltage variation detector 212 may be substituted with the analog ground.

The PMOS transistor of the divide voltage generator 211 may be substituted with the NMOS transistor having a P-well and the body and the source connected thereto.

As described above, the delay characteristic compensation circuit of the memory device according to the present invention is directed to compensating a delay characteristic of a delay device more rapidly by detecting a voltage variation caused by the bump noise using a coupling of the capacitor and by determining the enable state of the analog inverter having a different threshold voltage in accordance with the detected voltage.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. In a memory device separating a supply voltage into a digital supply voltage and an analog supply voltage, a delay characteristic compensation circuit:

signal delay means for sequentially delaying an input signal;

voltage variation detection means for detecting a variation of a digital supply voltage and adjusting the level of a divide voltage with respect to the supply voltage at a predetermined ratio;

code data generation means for generating a code data in accordance with the voltage adjusted by the voltage variation detection means; and delay characteristic compensation means for connecting a predetermined number of delay devices to a delay path of the delay means in accordance with a code data generated by the code data generation means for dividing the same so as to constantly maintain the delay characteristic of the delay means.

2. The circuit of claim 1, wherein said signal delay means has an output line connected to a plurality of inverters connected with the delay characteristic compensation means.

3. The circuit of claim 1, wherein said voltage variation detection means includes:

a divide voltage generator for dividing the digital supply voltage; and a voltage variation detector for detecting the amount of variation of the digital supply voltage and for outputting the detected voltage.

4. The circuit of claim 3, wherein said divide voltage generator includes:

a first PMOS transistor having a source terminal to which a substrate terminal thereof is connected and to which a digital supply voltage is supplied through a first resistor, and a gate terminal connected to a drain terminal thereof; and a second PMOS transistor having a source terminal connected with the substrate terminal thereof, the drain terminal of the first PMOS transistor, and an output line and a gate terminal connected with a drain terminal thereof and a ground terminal through a second resistor.

5. The circuit of claim 1, wherein said voltage variation detector includes first and second PMOS capacitors connected between a digital supply voltage and a ground terminal in series, and a connection point of the first and second PMOS capacitors connected with the output line of the divide voltage generator and the input line of the code data generator.

6. The circuit of claim 1, wherein said code data generation means includes:

a plurality of analog inverters enabled in accordance with the amount of variations detected by the voltage variation detection means; and a plurality of digital inverters connected to the plurality of the analog inverters in series by two digital inverters for amplifying the signal applied thereto from the analog inverters and for generating code data.

7. The circuit of claim 6, wherein said plurality of analog inverters are connected between the analog supply voltage and the ground terminal and have a logic threshold voltage different from each other.

8. The circuit of claim 6, wherein said plurality of digital inverters are connected between the digital supply voltage and the ground terminal.

9. The circuit of claim 1, wherein said delay characteristic compensation means includes:

a plurality of switches switched in accordance with a code data generated by the code data generation means for connecting a delay path of the signal delay means and for outputting the signal delayed by the signal delay means; and a plurality of delay devices for delaying the signal outputted from the plurality of the switches.

10. The circuit of claim 9, wherein said plurality of the switches includes a plurality of PMOS transistors and NMOS transistors each having a source terminal to which the output line of the digital inverters of the signal delay means is connected, the gate terminal to which the output line of the digital inverters of the code data generation means is commonly connected, and a drain terminal connected with each other and then connected with the input lines of the plurality of the delay devices, wherein the source terminal thereof is connected with a ground terminal.

11. The circuit of claim 9, wherein each of said plurality of delay devices includes a MOS capacitor or an inverter.

* * * * *